(12) United States Patent
Hirao et al.

(10) Patent No.: US 8,436,379 B2
(45) Date of Patent: May 7, 2013

(54) SEMICONDUCTOR LIGHT EMITTING DEVICE AND METHOD FOR MANUFACTURING THE SAME

(75) Inventors: Naoki Hirao, Kanagawa (JP); Toshihiko Watanabe, Kanagawa (JP)

(73) Assignee: Sony Corporation, Tokyo (JP)

( * ) Notice: Subject to any disclaimer, the term of this patent is extended or adjusted under 35 U.S.C. 154(b) by 146 days.

(21) Appl. No.: 12/844,417

(22) Filed: Jul. 27, 2010

(65) Prior Publication Data

US 2011/0031519 A1 Feb. 10, 2011

(30) Foreign Application Priority Data

Aug. 10, 2009 (JP) ................................ P2009-185798

(51) Int. Cl.
*H01L 33/00* (2010.01)

(52) U.S. Cl.
USPC .......... 257/98; 257/99; 257/100; 257/E33.06; 257/E33.068

(58) Field of Classification Search ............. 257/98–100
See application file for complete search history.

(56) References Cited

U.S. PATENT DOCUMENTS

| 2007/0023777 A1* | 2/2007 | Sonobe et al. ............... 257/103 |
| 2007/0145396 A1* | 6/2007 | Watanabe et al. ............... 257/98 |
| 2010/0136727 A1* | 6/2010 | Osawa et al. ................... 438/29 |

FOREIGN PATENT DOCUMENTS

| JP | 11-186598 | 7/1999 |
| JP | 11-214421 | 8/1999 |
| JP | 2003-069085 | 3/2003 |
| JP | 2007-081312 | 3/2007 |

OTHER PUBLICATIONS

Chou, C.H. et al., High thermally stable Ni/Ag(Al) alloy contacts on p-GaN, Applied Physics Letters 90, 022103 (2007).
Japanese Office Action issued Mar. 19, 2013 in corresponding Japanese Patent Application No. 2009-185798.

* cited by examiner

*Primary Examiner* — A. Sefer
(74) *Attorney, Agent, or Firm* — K&L Gates LLP

(57) ABSTRACT

A semiconductor light emitting device includes a light emitting portion, and an electrode formed on the light emitting portion. The electrode includes: a light reflecting layer configured to reflect light emitted from the light emitting portion and including a first metal; a first seed layer formed directly on the light reflecting layer and including a second metal; a second seed layer coating at least side surfaces of the light reflecting layer and the first seed layer, the second seed layer including a third metal; and a plating layer coating at least top and side surfaces of the second seed layer, the plating layer including a fourth metal.

14 Claims, 10 Drawing Sheets

LIGHT EMISSION

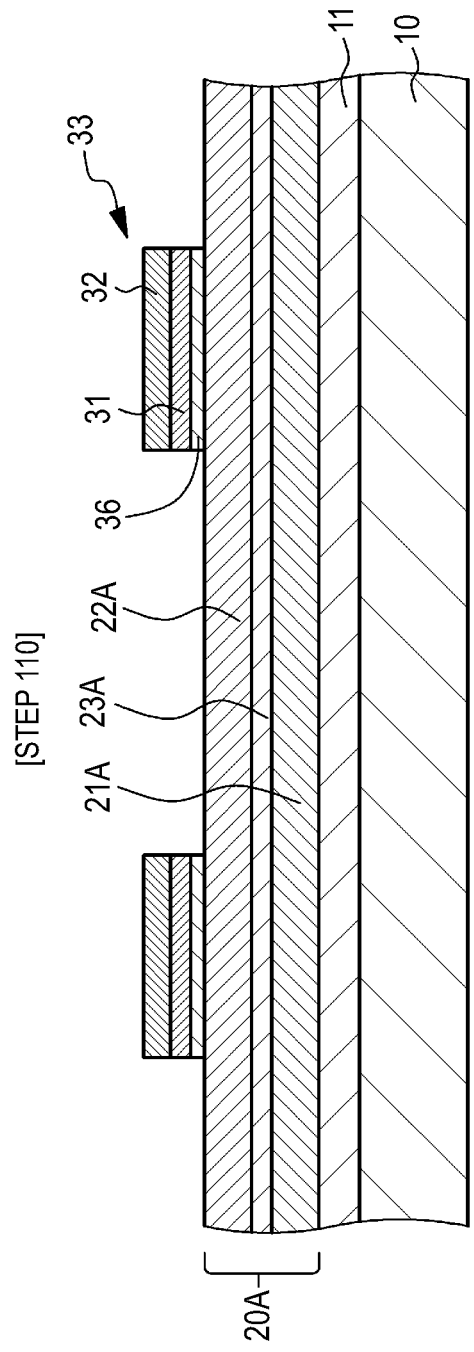
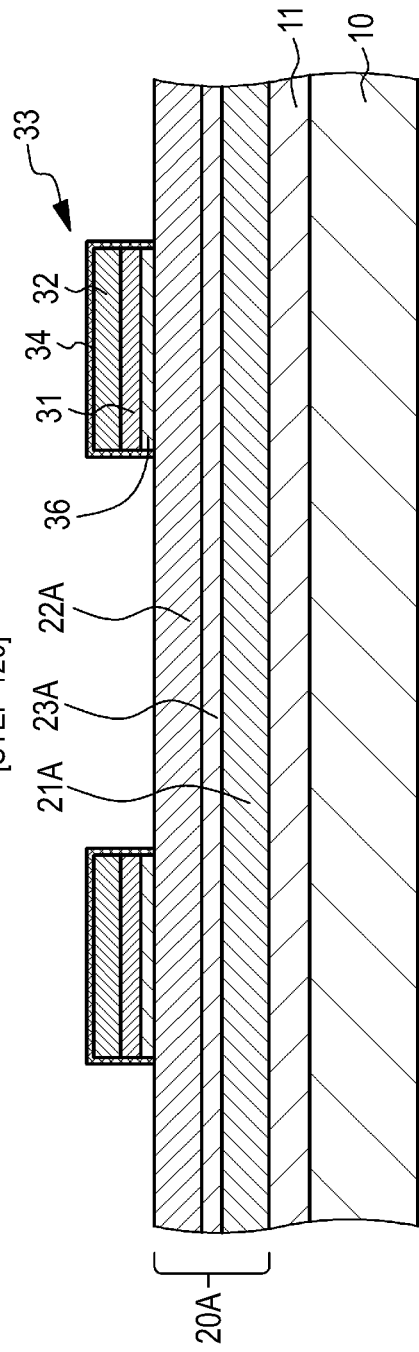

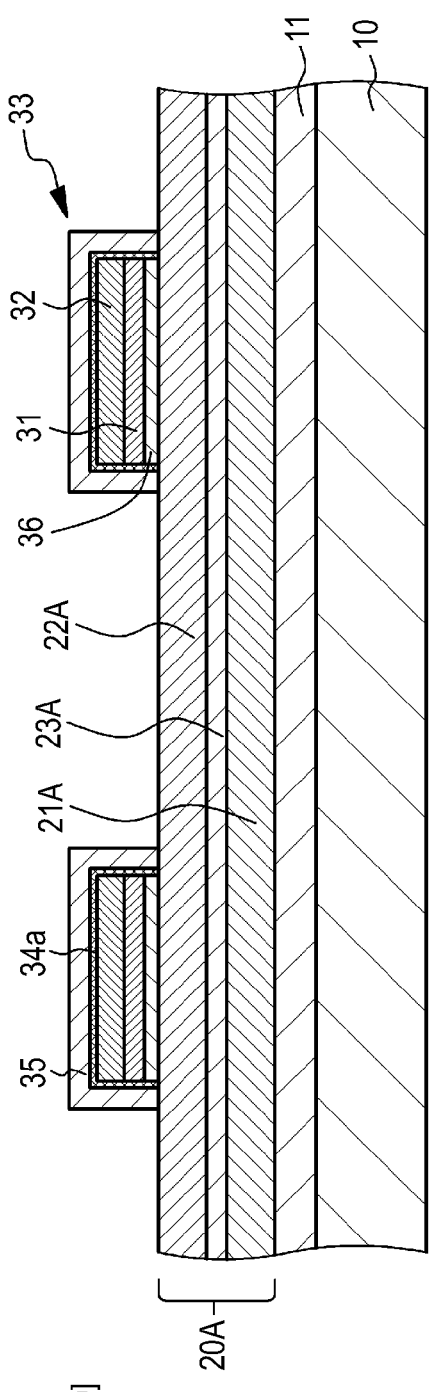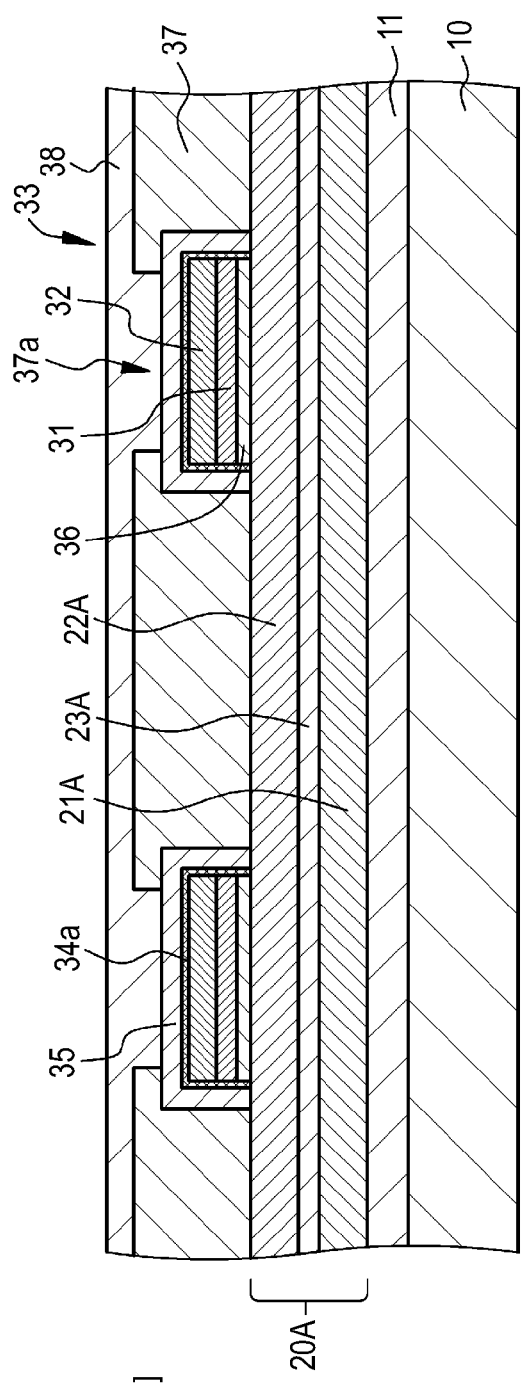
FIG.3A [STEP 130]
FIG.3B [STEP 140]

[STEP 200]

[STEP 200](CONT'D.)

[STEP 200](CONT'D.)

[STEP 200](CONT'D.)

[STEP 210]

[STEP 210](CONT'D.)

SEMICONDUCTOR LIGHT EMITTING DEVICE AND METHOD FOR MANUFACTURING THE SAME

CROSS REFERENCES TO RELATED APPLICATIONS

The present application claims priority to Japanese Patent Application JP 2009-185798 filed on Aug. 10, 2009, the entire contents of which is hereby incorporated by reference.

BACKGROUND

The present disclosure relates to a semiconductor light emitting device and a method for manufacturing the same.

As shown in FIG. 9, a semiconductor light emitting device such as a light emitting diode (LED) has a light emitting part composed of a convex laminated structure 20 in which a first compound semiconductor layer 21 having an n-type conductivity type, an active layer 23 and a second compound semiconductor layer 22 having a p-type conductivity type are successively laminated on a substrate for manufacturing a semiconductor light emitting device (hereinafter sometimes referred to simply as "substrate 10"). A first electrode (n-side electrode) 140 is provided on the substrate 10 or an exposed portion 21a of the first compound semiconductor layer 21, and a second electrode (p-side electrode) 130 is provided on a top surface of the second compound semiconductor layer 22. Such a semiconductor light emitting device can be classified into two kinds of a semiconductor light emitting device of a mode in which light is outgone from the active layer 23 via the second compound semiconductor layer 22 and a semiconductor light emitting device of a mode in which light is outgone from the active layer 23 via the first compound conductor layer 21 (the latter will be referred to as "bottom emission type" for the sake of convenience).

In the related-art semiconductor light emitting device of a bottom emission type, for the purpose of maintaining luminous efficiency high, in general, as shown in FIG. 9, a reflective electrode for reflecting visible light from the active layer 23 is frequently used for the second electrode 130. The second electrode 130 as a reflective electrode is constituted of, for example, a lower layer 131 made of silver (Ag) and an upper layer (cover metal) 132 made of nickel (Ni) from the bottom (see, for example, C. H. Chou, et al., "High thermally stable Ni/Ag(Al) alloy contacts on p-GaN", Applied Physics Letters, 90, 022102 (2007)). The upper layer 132 covers the lower layer 131. Here, by constituting the lower layer 131 of silver (Ag), a high light reflectance can be achieved. Also, by constituting the upper layer 132 of nickel (Ni), deterioration of the lower layer 131 to be caused due to oxidation is prevented, and occurrence of migration is prevented. In FIG. 9, a reference numeral 141 stands for an insulating layer; and each of reference numerals 142A and 142B stands for a contact part.

In general, the upper layer 132 is formed by a lift-off method. That is, after forming the lower layer 131, a resist layer 150 having an aperture 151 in a portion where the upper layer 132 is to be formed is formed on the basis of a photolithography technology (see FIG. 10A). Subsequently, the upper layer 132 is formed over the entire surface by a vacuum vapor deposition method (see FIG. 10B). Thereafter, by removing the resist layer 150 and the upper layer 132 located thereon, the second electrode structure shown in FIG. 9 can be obtained.

SUMMARY

However, in forming the upper layer (cover metal) 132 on the basis of such a lift-off method, a problem is caused in forming precision of the aperture 151 in the resist layer 150; a large alignment tolerance is required; and there may be the case where prevention of the oxidation of the lower layer 131 by the upper layer 132 or prevention of the occurrence of migration cannot be effectively achieved. In particular, the finer the size of a semiconductor light emitting device, the finer the second electrode (p-side electrode) 130; and therefore, these problems become remarkable.

Accordingly, it is desirable to provide a method for manufacturing a semiconductor light emitting device capable of forming especially a cover metal of a second electrode with high reliability and high precision and a semiconductor light emitting device obtained on the basis of such a method.

In an embodiment, a semiconductor light emitting device includes a light emitting portion, and an electrode formed on the light emitting portion. The electrode includes: a light reflecting layer configured to reflect light emitted from the light emitting portion and including a first metal; a first seed layer formed directly on the light reflecting layer and including a second metal; a second seed layer coating at least side surfaces of the light reflecting layer and the first seed layer, the second seed layer including a third metal; and a plating layer coating at least top and side surfaces of the second seed layer, the plating layer including a fourth metal.

In another embodiment, a semiconductor light emitting device includes a light emitting portion including a first semiconductor layer having a first conductivity type, an active layer, and a second semiconductor layer having a second conductivity type that is opposite to the first conductivity type. The semiconductor light emitting device also includes an electrode formed on the light emitting portion. The electrode includes: a light reflecting layer comprising Ag and configured to reflect light emitted from the light emitting portion; a first seed layer comprising Al and formed on the light reflecting layer; a second seed layer comprising Zn and coating at least side surfaces of the light reflecting layer and the first seed layer; and a plating layer comprising Ni and coating at least top and side surfaces of the second seed layer.

In another embodiment, a method of manufacturing a semiconductor light emitting device includes forming a light emitting portion and forming an electrode on the second semiconductor layer of the light emitting portion. Forming the electrode includes: forming a light reflecting layer configured to reflect light emitted from the light emitting portion and including a first metal; forming a first seed layer on the light reflecting layer, the first seed layer including a second metal; forming a second seed layer on at least side surfaces of the light reflecting layer and the first seed layer, the second seed layer including a third metal; and forming a plating layer on at least top and side surfaces of the second seed layer, the plating layer including a fourth metal. The light reflecting layer and the first seed layer are formed by a lift-off method.

In another embodiment, a method of manufacturing a semiconductor light emitting device includes forming a light emitting portion including a first semiconductor layer having a first conductivity type, an active layer, and a second semiconductor layer having a second conductivity type that is opposite to the first conductivity type. The method also includes forming an electrode on the light emitting portion by: forming a light reflecting layer comprising Ag and configured to reflect light emitted from the light emitting portion; forming a first seed layer comprising Al on the light reflecting layer; depositing a second seed layer comprising Zn on at least side surfaces of the light reflecting layer and the first seed layer; and forming a plating layer by electroless plating on at least top and side surfaces of the second seed layer, the plating layer comprising Ni. The light reflecting layer and the first seed layer are formed by a lift-off method.

In the semiconductor light emitting device or the manufacturing method thereof according to the embodiments, a plating layer (e.g., a Ni layer) is formed on the top surface and the side surface of the second seed layer (e.g., a Zn layer). That is, the whole of the second seed layer is covered by the plating layer as a cover metal. This plating layer is formed in a self-alignment mode relative to the electrode. In consequence, a problem is not caused in forming precision, and it is not necessary to take into consideration an alignment tolerance. Moreover, because of the fact that the whole of the second seed layer can be surely covered by the plating layer, oxidation or occurrence of migration of the second seed layer can be prevented, and a semiconductor light emitting device with high reliability can be provided. In particular, because of the fact that the finer the size of a semiconductor light emitting device, the finer the size of the electrode, there give rise remarkable effects according to the embodiments.

Additional features and advantages are described herein, and will be apparent from the following Detailed Description and the figures.

BRIEF DESCRIPTION OF THE FIGURES

FIGS. 2A and 2B are schematic partial sectional views of a laminated structure or the like for the purpose of explaining a manufacturing method of a semiconductor light emitting device of Example 1.

FIGS. 3A and 3B are schematic partial sectional views of a laminated structure or the like for the purpose of explaining a manufacturing method of a semiconductor light emitting device of Example 1, subsequent to FIG. 2B.

DETAILED DESCRIPTION

Figure 1A:
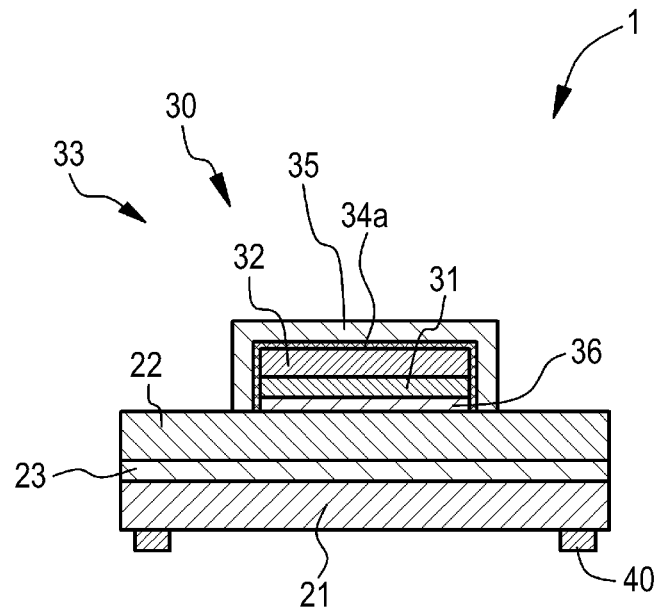
FIGS. 1A and 1B are schematic sectional views of a semiconductor light emitting device of Example 1.

Embodiments are hereunder described on the basis of the following Examples by reference to the accompanying drawings. The explanation is made in the following order.

1. Semiconductor light emitting device and manufacturing method thereof according to embodiment and explanation regarding the whole thereof.
2. Example 1 (Semiconductor light emitting device and manufacturing method thereof according to embodiment)
3. Example 2 (Modification of Example 1)
4. Example 3 (Other modification of Example 1)
5. Example 4 (Other modification of Example 1)
6. Example 5 (Other modification of Example 1)
7. Example 6 (Other modification of Example 1 and others)

Semiconductor Light Emitting Device and Manufacturing Method thereof According to an Embodiment In an embodiment, the manufacturing method of a semiconductor light emitting device includes (A) forming a laminated structure including a first compound semiconductor layer having a first conductivity type, forming an active layer on the first compound semiconductor layer and composed of a compound semiconductor layer, and forming a second compound semiconductor layer on the active layer and having a second conductivity type different from the first conductivity type. The method also includes (B) forming a first electrode that is electrically connected to the first compound semiconductor layer, and (C) forming a second electrode on the second compound semiconductor layer. In this embodiment, the step (C) of forming a second electrode includes (a) forming a second electrode structure, (b) forming a second seed layer or second seed region; and (c) forming a plating layer. The step of (a) forming a second electrode structure includes forming a laminate of a light reflective layer capable of reflecting light from the active layer and made of a conductive material, and forming a first seed layer containing a metal different from a metal contained in the light reflective layer from the side of the second compound semiconductor layer. The step of (b) forming the second seed layer or second seed region between the second electrode structure and the plating layer, the second seed layer containing a metal different from the metals contained in the light reflective layer, the first seed layer and the plating layer. Also, the step of (c) forming the plating layer includes forming the plating layer on a top surface and a side surface of the second electrode structure and containing a metal different from the metals contained in the light reflective layer and the first seed layer.

The manufacturing method of a semiconductor light emitting device according to the embodiment can adopt a configuration in which the second electrode structure is subjected to a zincate treatment in the step (b), thereby depositing a zinc layer as the second seed layer on a top surface and a side surface of the second electrode structure; and the top surface and the side surface of the second electrode structure are subjected to electroless nickel plating in the step (c), thereby forming a nickel layer (electroless nickel plating layer) on the top surface and the side surface of the second electrode structure.

The manufacturing method of a semiconductor light emitting device including such a preferred configuration according to the embodiment may further include the step of subjecting the second electrode structure to an oxygen plasma treatment between the step (a) and the step (b), whereby the surface of the second electrode structure is uniformly oxidized. As a result, it is possible to contrive to make the zinc layer to be deposited by the zincate treatment uniform. Furthermore, in the manufacturing method of a semiconductor light emitting device including such a step and such a preferred configuration according to the embodiment, after removing the zinc layer deposited by the zincate treatment in the step (b), a constitution in which the second electrode structure is subjected to a second zincate treatment between the step (b) and the step (c), thereby depositing a zinc layer on the top surface and the side surface of the second electrode structure can be adopted. In that case, a constitution in which the zinc layer deposited by the zincate treatment in the step (b) is removed with an acid between the step (b) and the step (c) can be adopted. By once removing the zinc layer deposited by the zincate treatment in the step (b) and then applying a second zincate treatment, higher adhesion between the second electrode structure and the nickel layer and uniformity can be obtained. Here, as the acid which is used for removing the zinc layer, it is desirable to use an acid which does not damage the second electrode structure constituted of a first layer containing silver and a second layer containing aluminum, such as sulfuric acid and nitric acid.

The manufacturing method of a semiconductor light emitting device including the previously described preferred configuration, constitution and steps according to embodiment may adopt a configuration in which the second electrode structure constituted of the first layer, a migration blocking layer and the second layer is formed in the step (a). Also, in the semiconductor light emitting device according to the embodiments, a configuration in which in the second electrode structure, the migration blocking layer is provided between the first layer and the second layer can be adopted. In this way, by providing the migration block layer between the first layer and the second layer, it is possible to suppress occurrence of the migration of a silver atom constituting the first layer. The migration blocking layer can be constituted of, for example, platinum (Pt) or gold (Au).

Alternatively, the manufacturing method of a semiconductor light emitting device including the previously described preferred configuration, constitution and steps according to the embodiment may adopt a configuration in which by forming an alloying layer which comes into contact with the second layer and then applying a thermal treatment in the step (a), alloying between aluminum contained in the second layer and a metal contained in the alloying layer is promoted, thereby obtaining the second layer made of an aluminum alloy. Also, in the semiconductor light emitting device according to the embodiments, a configuration in which the second layer is made of an aluminum alloy can be adopted. In this way, by constituting the second layer of an aluminum alloy, a speed (displacement rate) at which aluminum (Al) is displaced by zinc (Zn) in the zincate treatment can be controlled; a uniform zinc layer can be formed; abnormal deposition of a nickel layer (electroless nickel plating layer) or occurrence of abnormality of the deposition shape can be prevented; and a uniform nickel layer (electroless nickel plating layer) can be formed. Also, by controlling the displacement rate, it is possible to prevent adverse influences occurring on the first layer (occurrence of a phenomenon, for example, elution of silver constituting the first layer or side etching of the first layer). Examples of a material constituting the alloying layer include gold (Au), copper (Cu), silver (Ag), titanium (Ti), palladium (Pd) and platinum (Pt). The alloying layer may be formed directly under the second layer or may be formed directly above the second layer.

Alternatively, the manufacturing method of a semiconductor light emitting device including the previously described preferred configuration, constitution and steps according to the embodiment may adopt a configuration in which a covering layer is formed on the second layer in the step (a), thereby obtaining the second electrode structure composed of the first layer, the second layer and the covering layer, and thereafter, the second electrode structure is subjected to a zincate treatment in the step (b), thereby depositing a zinc layer on the top surface and the side surface of the second electrode structure. Also, the semiconductor light emitting device according to the embodiments may adopt a configuration in which in the second electrode structure, the covering layer is provided on the top surface of the second layer. In this way, by providing the covering layer on the top surface of the second layer, a displacement amount at which aluminum (Al) is displaced by zinc (Zn) in the zincate treatment can be controlled; a uniform zinc layer can be formed; abnormal deposition of a nickel layer (electroless nickel plating layer) or occurrence of abnormality of the deposition shape can be prevented; and a uniform electroless nickel plating layer can be formed. Also, by controlling the displacement amount, it is possible to make the first layer free from occurrence of adverse influences (occurrence of a phenomenon, for example, elution of silver constituting the first layer or side etching of the first layer). Examples of a material constituting the covering layer include metals which do not cause deposition of zinc by the zincate treatment, such as gold (Au), iron (Fe), nickel (Ni), titanium (Ti), silver (Ag), palladium (Pd), copper (Cu), platinum (Pt) and chromium (Cr).

The manufacturing methods of a semiconductor light emitting device including the previously described preferred configuration, constitution and steps according to the embodiment (these methods will be hereinafter generically named as "manufacturing method of the embodiment") may further include the step of subjecting the second electrode structure to a known oxide film removal treatment between the step (a) and the step (b).

The manufacturing methods of a semiconductor light emitting device including the previously described preferred configuration, constitution and steps according to the embodiment, the semiconductor light emitting device including the previously described preferred configuration and constitution according to the embodiments, though the first conductivity type and the second conductivity type may be an n-type and a p-type, respectively, the first conductivity type and the second conductivity type may also be a p-type and an n-type, respectively.

In the semiconductor light emitting device according to an embodiment, silver (Ag) can be exemplified as a metal which is contained in the light reflective layer; aluminum (Al) can be exemplified as a metal which is contained in the first seed layer; nickel (Ni) can be exemplified as a metal which is contained in the plating layer; and zinc (Zn) can be exemplified as a metal which is contained in the second seed region.

In the embodiment, the zincate treatment per se can be a known zincate treatment. In the zincate treatment, by dipping the second electrode structure (or the whole of the laminated structure including the second electrode structure) in a zincate treatment liquid, aluminum is displaced by zinc, and the zinc layer is deposited. This zinc layer covers not only the second layer but also the first layer (specifically, the exposed side surface of the first layer). Also, even in the case where the covering layer is formed on the second layer, the zinc layer covers not only the exposed side surface of the second layer but also the first layer (specifically, the exposed side surface of the first layer) and the top surface and the side surface of the covering layer. That is, the whole of the second electrode structure is covered by the zinc layer. By subjecting the second electrode structure to electroless nickel plating, zinc is displaced by nickel, the nickel layer is deposited, and a considerable portion of the zinc layer disappears. However, the zinc layer is finally left. Since the left zinc layer may include a layered portion or may include an island-shaped portion, it is expressed as "zinc-containing region".

In the embodiment, specifically, the first layer or the light reflective layer is made of a pure silver layer or a silver alloy layer. Examples of the silver alloy include silver alloys containing not more than 1% by weight of indium (In); and silver alloys containing from 0.1% by weight to 10% by weight of palladium and also containing from 0.1% by weight to 3% by weight of at least one element selected from the group consisting of copper, aluminum, gold, platinum, tantalum, chromium, titanium, nickel, cobalt and silicon. Also, specifically, the second layer or the first seed layer is made of a pure aluminum layer or an aluminum alloy layer. Examples of the aluminum alloy include Al/Cu and Al/Co/Ni/C in addition to Al/Au.

A close contact layer made of, for example, nickel (Ni) may be formed between the first layer and the second compound semiconductor layer. However, the formation of the close contact layer is not essential.

The second electrode structure including the covering layer, the alloying layer and the close contact layer can be formed by a variety of PVD methods or a variety of CVD methods. Examples of the PVD method include (a) a variety of vacuum vapor deposition methods such as an electron beam heating method, a resistance heating method, a flash vapor deposition method and a pulse laser deposition (PLD) method; (b) a plasma vapor deposition method; (c) a variety of sputtering methods such as a bipolar sputtering method, a direct current sputtering method, a direct current magnetron sputtering method, a high frequency sputtering method, a magnetron sputtering method, an ion beam sputtering method and a bias sputtering method; (d) a variety of ion plating methods such as a DC (direct current) method, an RF method, a multi-cathode method, an activating reaction method, an HCD (hollow cathode discharge) method, an electric field vapor deposition method, a high frequency ion plating method and a reactive ion plating method; and (e) an IVD method (ion vapor deposition method). Also, examples of the CVD method include an atmospheric pressure CVD method, a reduced pressure CVD method, a thermal CVD method, a plasma CVD method, a photo-CVD method and a laser CVD method. By successively depositing the first layer, the second layer and the like constituting the second electrode structure and then patterning the second layer, the first layer and the like, the second electrode structure can be obtained. Also, the second electrode structure can be obtained on the basis of a so-called lift-off method.

In the embodiment, examples of the first electrode include Ti, TiW, TiMo, Ti/Ni/Au, Ti/Pt/Au, (Ti/)TiW/Pt/Au, (Ti/)TiW/Pd/TiW/Pt/Au, Al, an aluminum alloy, AuGe and AuGe/Ni/Au. The layer before the term "/" is located near the active layer. Alternatively, the first electrode can also be constituted of a transparent conductive material such as ITO, IZO, ZnO:Al and ZnO:B. Though the first electrode is electrically connected to the first compound semiconductor layer, the first electrode may be formed on the first compound semiconductor layer; and in the case where a substrate for manufacturing a semiconductor light emitting device has conductivity, the first electrode may be formed on the substrate for manufacturing a semiconductor light emitting device. If desired, the first electrode or the second electrode (including an extending part of such an electrode) may be provided with a connecting layer or a contact part (pad part) composed of a multilayered metal layer having a laminated constitution such as [adhesive layer (for example, a Ti layer, a Cr layer, etc.)]/[barrier metal layer (for example, a Pt layer, an Ni layer, a TiW layer, an Mo layer, etc.)]/[metal layer with good compatibility against mounting (for example, an Au layer)], for example, (Ti layer)/(Pt layer)/(Au layer), etc. The first electrode, the connecting layer and the contact part (pad part) can be formed by, for example, a variety of PVD methods such as a vacuum vapor deposition method and a sputtering method, a variety of CVD methods or a plating method.

In manufacturing a semiconductor light emitting device, a substrate for manufacturing a semiconductor light emitting device is used. Examples of the substrate for manufacturing a semiconductor light emitting device include a GaAs substrate, a GaN substrate, an SiC substrate, an alumina substrate, a sapphire substrate, a ZnS substrate, a ZnO substrate, an AlN substrate, an LiMgO substrate, an LiGaO$_2$ substrate, an MgAl$_2$O$_4$ substrate, an InP substrate, an Si substrate, a Ge substrate, a GaP substrate, an AlP substrate, an InN substrate, an AlGaInN substrate, an AlGaN substrate, an AlInN substrate, a GaInN substrate, an AlGaInP substrate, an AlGaP substrate, an AlInP substrate, a GaInP substrate and substrates obtained by forming an underlayer or a buffer layer on the surface (principal surface) of the foregoing substrate.

In the embodiment, though the semiconductor light emitting device is provided on the substrate for manufacturing a semiconductor light emitting device, there may be the case where the substrate for manufacturing a semiconductor light emitting device is finally removed, or it is finally left. Also, examples of a final configuration of the semiconductor light emitting device include a configuration in which the semiconductor light emitting device is mounted on a supporting substrate or a substrate for mounting. Examples of the supporting substrate and the substrate for mounting include a glass plate, a metal plate, an alloy plate, a ceramic plate, a plastic plate and a plastic film. The supporting substrate or the substrate for mounting may be provided with a wiring, thereby connecting the second electrode or the first electrode to the wiring.

In the embodiment, examples of a variety of compound semiconductor layers including an active layer include a GaN based compound semiconductor (including an AlGaN mixed crystal, an AlGaInN mixed crystal or a GaInN mixed crystal), a GaInNAs based compound semiconductor (including a GaInAs mixed crystal or a GaNAs mixed crystal), an AlGaInP based compound semiconductor, an AlAs based compound semiconductor, an AlGaInAs based compound semiconductor, an AlGaAs based compound semiconductor, a GaInAs based compound semiconductor, a GaInAsP based compound semiconductor, a GaInP based compound semiconductor, a GaP based compound semiconductor, an InP based compound semiconductor, an InN based compound semiconductor and an AlN based compound semiconductor. Examples of an n-type impurity which is added in the compound semiconductor layer include silicon (Si), selenium (Se), germanium (Ge), tin (Sn), carbon (C) and titanium (Ti); and examples of a p-type impurity which is added in the compound semiconductor layer include zinc (Zn), magnesium (Mg), beryllium (Be), cadmium (Cd), calcium (Ca), barium (Ba) and oxygen (O). The active layer may be constituted of a single compound semiconductor layer, and the active layer may have a single quantum well structure [QW structure] or a multiple quantum well structure [MQW structure]. Examples of the formation method (deposition method) of a variety of compound semiconductor layers including an active layer include a metalorganic chemical vapor deposition method (MOCVD method or MOVPE method), a metalorganic molecular beam epitaxy method (MOMBE method) and a hydride vapor phase epitaxy method (HVPE method) in which a halogen contributes to the transport or reaction.

Examples of a gas in the MOCVD method for forming a compound semiconductor layer include known gases such as a trimethylgallium (TMG) gas, a triethylgallium (TEG) gas, a trimethylaluminum (TMA) gas, a trimethylindium (TMI) gas and arsin ($AsH_3$). Examples of a nitrogen source gas include an ammonia gas and a hydrazine gas. Also, for example, in the case of adding silicon (Si) as the n-type impurity (n-type dopant), a monosilane gas ($SiH_4$ gas) may be used as an Si source; and in the case of adding selenium (Se) as the n-type impurity (n-type dopant), an $H_2Se$ gas may be used as an Se source. On the other hand, in the case of adding magnesium (Mg) as the p-type impurity (p-type dopant), a cyclopentadienylmagnesium gas, methylcyclopentadienylmagnesium or biscyclopentadienylmagnesium (Cp2Mg) may be used as an Mg source; and in the case of adding zinc (Zn) as the p-type impurity (p-type dopant), dimethylzinc (DMZ) may be used as a Zn source. Examples of the n-type impurity (n-type dopant) include Ge, Se, Sn, C and Ti in addition to Si; and examples of the p-type impurity (p-type dopant) include Zn, Cd, Be, Ca, Ba and O in addition to Mg. Also, in manufacturing a red semiconductor light emitting device, examples of a gas to be used include trimethylaluminum (TMA), triethylaluminum (TEA), trimethylgallium (TMG), triethylgallium (TEG), trimethylindium (TMI), triethylindium (TEI), phosphine ($PH_3$), arsine, dimethylzinc (DMZ), diethylzinc (DEZ), $H_2S$, hydrogen selenide ($H_2Se$) and biscyclopentanediethylzinc.

In the embodiment, specifically, a light emitting diode (LED) can be constituted as the semiconductor light emitting device. Here, with respect to the size of the light emitting diode, specifically, an area $S_1$ of the active layer is $3 \times 10^{-11}$ $m^2 \leq S_1 \leq 3 \times 10^{-7}$ $m^2$, and preferably $1 \times 10^{-10}$ $m^2 \leq S_1 \leq 1 \times 10^{-9}$ $m^2$. In the embodiment, a configuration in which light from the active layer is outgone outside via the first compound semiconductor layer is desirable.

In the embodiment, as described previously, the semiconductor light emitting device may be mounted on a substrate for mounting. In that case, the number of the semiconductor light emitting device to be mounted on the substrate for mounting is plural, and the number, type, mounting (disposition), interval and the like of the semiconductor light emitting device may be determined depending upon the specification, application, function and the like which are required for a product provided with a semiconductor light emitting device. Examples of the product obtained by mounting the semiconductor light emitting device on the substrate for mounting include an image display apparatus, a backlight using a semiconductor light emitting device and a lighting apparatus. As a red semiconductor light emitting device (red light emitting diode), a green semiconductor light emitting device (green light emitting diode) and a blue semiconductor light emitting device (blue light emitting diode), for example, those using a nitride based III-V group compound semiconductor can be used; and as a red semiconductor light emitting device (red light emitting diode), for example, those using an AlGaInP based compound semiconductor can also be used. Furthermore, specifically, besides the light emitting diode (LED), for example, a semiconductor laser of an edge emission type or a surface emitting laser device (vertical cavity surface emitting laser: VCSEL) can be constituted of the semiconductor light emitting device.

Example 1

Example 1 is concerned with a manufacturing method of a semiconductor light emitting device and semiconductor light emitting devices according to an embodiment. In Example 1, specifically, a semiconductor light emitting device 1 is composed of a light emitting diode.

Figure 1B:
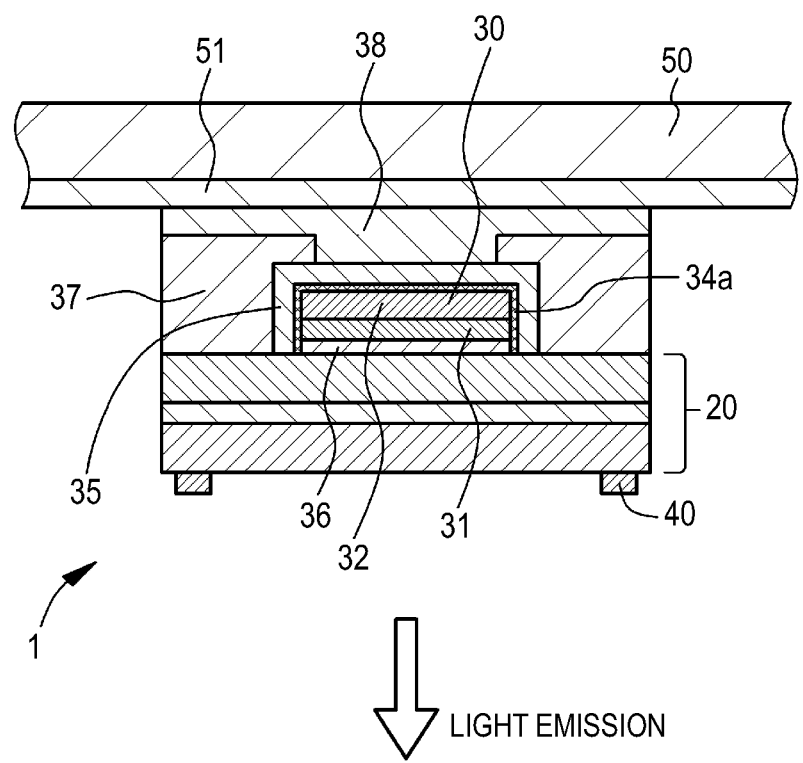

As shown in schematic sectional views of FIGS. 1A and 1B, the semiconductor light emitting device 1 of Example 1 is provided with:

(A) a laminated structure (light emitting part) 20 constituted of a first compound semiconductor layer 21 having a first conductivity type (specifically, an n-type in Example 1); an active layer 23 formed on the first compound semiconductor layer 21 and made of a compound semiconductor layer; and a second compound semiconductor layer 22 formed on the active layer 23 and having a second conductivity type (specifically, a p-type in Example 1) different from the first conductivity type, (B) a first electrode (n-side electrode) 40 electrically connected to the first compound semiconductor layer 21, and (C) a second electrode (p-side electrode) 30 formed on the second compound semiconductor layer 22.

Here, the second electrode 30 is constituted of:

a second electrode structure 33 constituted of a first layer 31 containing silver and a second layer 32 containing aluminum from the side of the second compound semiconductor layer 22, and a nickel layer 35 formed on a top surface and a side surface of the second electrode structure 33.

FIG. 1B shows a state in which the semiconductor light emitting device shown in FIG. 1A is installed on a supporting substrate 50.

A region 34a containing zinc is further included between the top surface and the side surface of the second electrode structure 33 and the nickel layer 35. Alternatively, the nickel layer 35 is formed by deposition of a zinc layer 34 on the second electrode structure 33 on the basis of a zincate treatment on the second electrode structure 33 and a subsequent electroless nickel plating treatment.

Alternatively, the semiconductor light emitting device of Example 1 is provided with:

(A) a laminated structure 20 constituted of a first compound semiconductor layer 21 having a first conductivity type (n-type); an active layer 23 formed on the first compound semiconductor layer 21 and made of a compound semiconductor layer; and a second compound semiconductor layer 22 formed on the active layer 23 and having a second conductivity type (p-type) different from the first conductivity type, (B) a first electrode (n-side electrode) 40 electrically connected to the first compound semiconductor layer 21, and (C) a second electrode (p-side electrode) 30 formed on the second compound semiconductor layer 22.

Here, the second electrode 30 is constituted of:

a second electrode structure 33 composed of a laminate of a light reflective layer 31 capable of reflecting light from the active layer 23 and made of a conductive material and a first seed layer 32 containing a metal different from a metal contained in the light reflective layer 31 from the side of the second compound semiconductor layer 22, and a plating layer 35 formed on a top surface and a side surface of the second electrode structure 33 and containing a metal different from the metals contained in the light reflective layer 31 and the first seed layer 32, and the second electrode 30 further includes a second seed region 34a located between the second electrode structure 33 and the plating layer 35 and containing a metal different from the metals contained in the light reflective layer 31, the first seed layer 32 and the plating layer 35.

Here, the metal contained in the light reflective layer 31 is silver (Ag); the metal contained in the first seed layer 32 is aluminum (Al); the metal contained in the plating layer 35 is nickel (Ni); and the metal contained in the second seed region 34a is zinc (Zn). More specifically, in Example 1, the first layer or light reflective layer 31 is made of a pure silver layer; and the second layer or first seed layer 32 is made of a pure aluminum layer. Also, a close contact layer 36 made of nickel (Ni) is formed between the first layer 31 and the second compound semiconductor layer 22.

In Example 1, the first electrode 40 is formed on the surface of the first compound semiconductor layer 21 on the opposite side to the surface coming into contact with the active layer 23. Also, the compound semiconductor constituting each of the first compound semiconductor layer 21, the active layer 23 and the second compound semiconductor layer 22 is constituted of $Al_XGa_YIn_{1-X-Y}N$ ($0 \leq X \leq 1$, $0 \leq Y \leq 1$ and $0 \leq (X+Y) \leq 1$), and more specifically a GaN based compound semiconductor. That is, the first compound semiconductor layer 21 is made of GaN doped with Si (GaN:Si); and the active layer 23 is made of an InGaN layer (well layer) and a GaN layer (barrier layer) and has a multiple quantum well structure. Also, the second compound semiconductor layer 22 is made of GaN doped with Mg (GaN:Mg). The light emitting part is constituted of the laminated structure 20 in which the first compound semiconductor layer 21, the active layer 23 and the second compound semiconductor layer 22 are laminated. Furthermore, the first electrode 40 is made of a metal laminated film having a Ti/Pt/Au structure; each of the Ti film and the Pt film has a thickness of, for example, 50 nm; and the Au film has a thickness of, for example, 2 μm. Light from the active layer 23 is outgone outside via the first compound semiconductor layer 21. The size of the light emitting diode, specifically, an area of the active layer 23 is $4 \times 10^{-10}$ m².

The manufacturing method of the semiconductor light emitting device 1 of Example 1 is hereunder described by reference to the accompanying drawings.

[Step 100A]

First of all, a first compound semiconductor layer 21A having a first conductivity type, an active layer 23A and a second compound semiconductor layer 22A having a second conductivity type different from the first conductivity type are successively formed on the principal surface of a substrate 10 for manufacturing a semiconductor light emitting device. Since each of the first compound semiconductor layer 21A, the active layer 23A and the second compound semiconductor layer 22A is in a state before patterning, an alphabet "A" is given in the end of each of the reference numerals. The same is also applicable to the reference numeral expressing each layer in the following explanation.

Specifically, the substrate 10 for manufacturing a semiconductor light emitting device made of sapphire is conveyed into an MOCVD apparatus and subjected to substrate cleaning in a carrier gas composed of hydrogen at a substrate temperature of 1,050° C. for 10 minutes, and thereafter, the substrate temperature is lowered to 500° C. Then, a trimethylgallium (TMG) gas as a gallium raw material is fed while feeding an ammonia gas as a nitrogen raw material on the basis of an MOCVD method, thereby subjecting an underlayer 11 made of GaN to crystal growth on the surface of the substrate 10 for manufacturing a semiconductor light emitting device, and thereafter, the feed of the TMG gas is interrupted.

[Step 100B]

Subsequently, a laminated structure 20A in which the first compound semiconductor layer 21A having an n-type conductivity type, the active layer 23A and the second semiconductor layer 22A having a p-type conductivity type are successively laminated is formed on the substrate 10 for manufacturing a semiconductor light emitting device.

Specifically, the substrate temperature is raised to 1,020° C., and thereafter, feed of a monosilane ($SiH_4$) gas as a silicon raw material is started at atmospheric pressure on the basis of the MOCVD method, thereby subjecting the first compound semiconductor layer 21A having a thickness of 3 μm and having an n-type conductivity type and made of GaN doped with Si (GaN:Si) to crystal growth on the substrate layer 11. A doping concentration is, for example, about $5 \times 10^{18}$/cm³.

Thereafter, the feed of each of the TMG gas and the $SiH_4$ gas is once interrupted, and the substrate temperature is lowered to 750° C. Then, a triethylgallium (TEG) gas and a trimethylindium (TMI) gas are used, and these gases are fed by means of valve switching, thereby subjecting the active layer 23A having a multiple quantum well structure and made of InGaN and GaN to crystal growth.

For example, so far as a light emitting diode having a light emission wavelength of 400 nm is concerned, a multiple quantum well structure (composed of, for example, a well layer of two layers) of InGaN having an In composition of about 9% and GaN (having a thickness of 2.5 nm and 7.5 nm, respectively) may be adopted. Also, so far as a blue light emitting diode having a light emission wavelength of 460 nm±10 nm is concerned, a multiple quantum well structure (composed of, for example, a well layer of 15 layers) of InGaN having an In composition of 15% and GaN (having a thickness of 2.5 nm and 7.5 nm, respectively) may be adopted. Furthermore, so far as a green light emitting diode having a light emission wavelength of 520 nm±10 nm is concerned, a multiple quantum well structure (composed of, for example, a well layer of 9 layers) of InGaN having an In composition of 23% and GaN (having a thickness of 2.5 nm and 15 nm, respectively) may be adopted.

After completion of the formation of the active layer 23A, the feed of each of the TEG gas and the TMI gas is interrupted, the carrier gas is switched from nitrogen to hydrogen, the substrate temperature is elevated to 850° C. and feed of each of a TMG gas and a biscyclopentadienylmagnesium ($Cp_2Mg$) gas is started, thereby subjecting the second compound semiconductor layer 22A having a thickness of 100 nm and made of GaN doped with Mg (GaN:Mg) to crystal growth on the active layer 23A. A doping concentration is about $5 \times 10^{19}$/cm³. Thereafter, the feed of each of the TMG gas and the $Cp_2Mg$ gas is stopped, and the substrate temperature is lowered to room temperature, thereby completing the crystal growth.

[Step 100C]

After the crystal growth is thus completed, an annealing treatment is carried out in a nitrogen gas atmosphere at about 800° C. for 10 minutes, thereby activating a p-type impurity (p-type dopant).

[Step 110]

Thereafter, the second electrode structure 33 constituted of the first layer (light reflective layer) 31 containing silver and the second layer (first seed layer) 32 containing aluminum is formed from the side of the second compound semiconductor layer 22A. Specifically, the close contact layer 36 made of a nickel thin film having a thickness of 1 nm, the first layer (light reflective layer) 31 made of a silver layer having a thickness of 0.2 μm and the second layer (first seed layer) 32 made of an aluminum layer having a thickness of 0.1 μm are formed on the second compound semiconductor layer 22A on the basis of a lift-off method. There can be thus obtained a structure shown in FIG. 2A.

[Step 120]

Subsequently, if desired, after the second electrode structure 33 is subjected to a known oxide film removal treatment, the resulting second electrode structure 33 is subjected to a zincate treatment, thereby depositing the zinc layer (second seed layer) 34 on the second electrode structure 33. That is, the second electrode structure 33 is subjected to a zincate treatment, thereby depositing the zinc layer 34 on the top surface and the side surface of the second electrode structure 33. In the zincate treatment, the whole of the laminated structure 20 including the second electrode structure 33 is dipped in a zincate treatment liquid. According to this, aluminum in the second layer 32 is displaced by zinc, whereby the zinc layer 34 is deposited. This zinc layer 34 covers not only the second layer 32 but also the first layer 31 (specifically, the exposed side surface of the first layer 31) and also the side surface of the close contact layer 36. There can be thus obtained a structure shown in FIG. 2B.

[Step 130]

Thereafter, the second electrode structure 33 is subjected to electroless nickel plating. That is, the top surface and the side surface of the second electrode structure 33 are subjected to electroless nickel plating, thereby forming the nickel layer (plating layer or electroless nickel plating layer) 35 on the top surface and the side surface of the second electrode structure 33. In the electroless nickel plating treatment, the whole of the laminated structure 20 including the second electrode structure 33 is dipped in an electroless nickel plating liquid. There can be thus obtained a structure shown in FIG. 3A. By the electroless nickel plating on the second electrode structure 33, zinc is displaced by nickel, the nickel layer 35 is deposited, and a considerable portion of the zinc layer 34 disappears. However, the zinc layer 34 is finally left. Since the left zinc layer 34 may include a layered portion or may include an island-shaped portion, more precisely, the zinc layer 34 becomes the zinc-containing region (second seed region) 34a. However, in FIG. 3A, the zinc-containing region (second seed region) 34a is expressed as a continuous layer for the sake of convenience.

[Step 140]

Subsequently, an insulating layer 37 is formed on the entire surface; an aperture 37a is formed in a portion of the insulating layer 37 in an upper part of the second electrode 30; and thereafter, a connecting layer 38 extending on the insulating layer 37 from the upper part of the second electrode 30 (see FIG. 3B). Thereafter, the insulating layer 37 including the connecting layer 38 and the supporting substrate 50 are stuck to each other via an adhesive layer 51 made of an epoxy based adhesive, and the substrate 10 for manufacturing a semiconductor light emitting device is then removed by mechanical polishing and a wet etching method.

[Step 150]

Thereafter, a patterned resist layer is formed on the exposed first compound semiconductor layer 21A on the basis of a lithography technology, and the first electrode 40 is formed on the first compound semiconductor layer 21A using such a resist layer on the basis of a so-called lift-off method.

[Step 160]

Thereafter, a patterned resist layer is formed on the exposed first compound semiconductor layer 21A on the basis of a lithography technology; the first compound semiconductor layer 21A, the active layer 23A, the second compound semiconductor layer 22A, the insulating layer 37 and the connecting layer 38 are patterned by an RIE technology using a $Cl_2$ based gas while using such a resist layer as an etching mask; and the resist layer is then removed. In this way, a light emitting part composed of the laminated structure 20, in which the first compound semiconductor layer 21, the active layer 23 and the second compound semiconductor layer 22 are patterned, can be obtained. A distance (formation pitch) between a center of the adjacent semiconductor light emitting device 1 and a center of the semiconductor light emitting device 1 is, for example, 30 μm.

There can be thus manufactured the semiconductor light emitting device 1 of Example 1.

[Step 170]

Thereafter, the semiconductor light emitting device 1 may be separated by cutting the supporting substrate 50. Furthermore, a variety of semiconductor light emitting devices (specifically, light emitting diodes), for example, semiconductor light emitting devices of a lamp type and semiconductor light emitting devices of a surface mount type can be prepared by performing resin molding and packaging.

In the semiconductor light emitting device or the manufacturing method thereof of Example 1, the nickel layer or plating layer 35 is formed on the top surface and the side surface of the second electrode structure 33. That is, the whole of the second electrode structure 33 is covered by the nickel layer or plating plate 35 as a cover metal. This nickel layer or plating layer 35 is formed in a self-alignment mode relative to the second electrode structure 33; and therefore, a problem is not caused in forming precision, and it is not necessary to take into consideration an alignment tolerance. Moreover, because of the fact that the whole of the second electrode structure 33 can be surely covered by the nickel layer or plating layer 35, oxidation or occurrence of migration of the second electrode structure 33 can be prevented, and a semiconductor light emitting device with high reliability can be provided.

Example 2

Example 2 is a modification of Example 1. In Example 2, the semiconductor light emitting devices 1 obtained in Example 1 are rearranged in an array state (two-dimensional matrix state), thereby preparing, for example, an image display apparatus. Specifically, in Example 2, subsequent to the Step 160, steps as described below are carried out.

[Step 200]

In this step, first of all, the semiconductor light emitting devices 1 are chosen at a desired pitch. More specifically, the semiconductor light emitting devices 1 are chosen at a pitch of every M number in the X-direction and every N number in the Y-direction among a number of the semiconductor light emitting devices 1 obtained in [Step 160] in Example 1, and arranged in a two-dimensional matrix state on the supporting substrate 50. Also, an interconnection substrate 60 in which a slightly adhesive layer 61 made of a silicone rubber is formed; and a second interconnection substrate 70 made of a glass substrate, in which alignment marks (not illustrated) made of a metal thin film or the like are previously formed in prescribed positions and an adhesive layer 71 made of an uncured photosensitive resin is formed on the surface thereof, are prepared.

Examples of a material constituting the interconnection substrate 60 include a glass plate, a metal plate, an alloy plate, a ceramic plate, a semiconductor plate and a plastic plate. Also, the interconnection substrate 60 is held by a non-illustrated positioning apparatus. A positional relation between the interconnection substrate 60 and the supporting substrate 50 can be regulated by the working of the positioning apparatus.

Basically, the adhesive layer 71 may be constituted of any material so far as it is a material capable of displaying an adhesive function on the basis of some method, such as a material capable of displaying an adhesive function upon irradiation with energy rays, for example, light (especially, ultraviolet rays, etc.), radioactive rays (for example, X-rays, etc.), electron beams, etc.; and a material capable of displaying an adhesive function upon application of heat, a pressure, etc. Examples of a material which can be easily formed and which is capable of displaying an adhesive function include resin based adhesives, in particular, photosensitive adhesives, thermosetting adhesives and thermoplastic adhesives. For example, in the case of using a photosensitive adhesive, it is possible to make the adhesive layer display an adhesive function by irradiating the adhesive layer with light or ultraviolet rays or heating it. Also, in the case of using a thermosetting adhesive, it is possible to make the adhesive layer to display an adhesive function by heating the adhesive layer upon irradiation with light or the like. Furthermore, in the case of using a thermoplastic adhesive, it is possible to bring fluidity by selectively heating a part of the adhesive layer upon irradiation with light or the like, thereby melting such a part. Other examples of the adhesive layer include a pressure-sensitive adhesive layer (for example, an adhesive layer made of an acrylic resin, etc.).

Figure 4A:
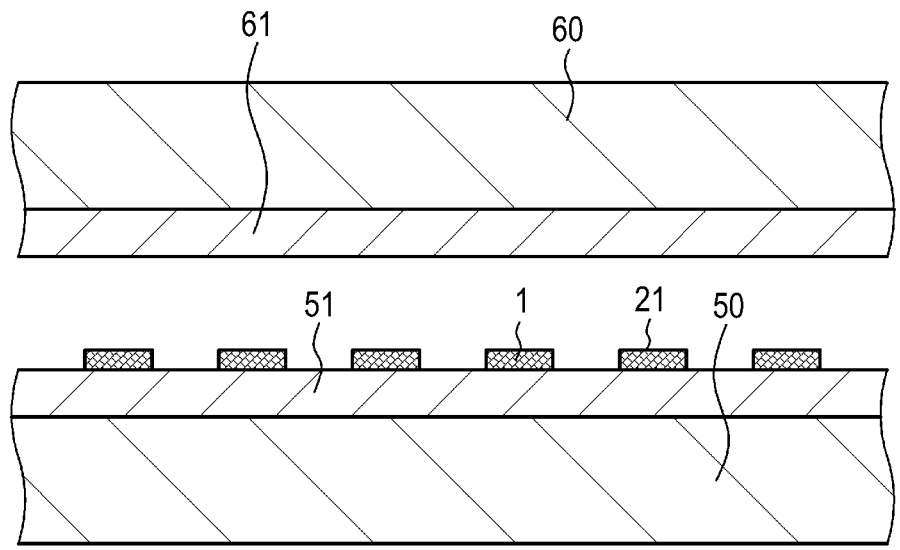
FIGS. 4A and 4B are schematic partial sectional views of a semiconductor light emitting device or the like for the purpose of explaining a preparation method of an image display apparatus of Example 2.
Figure 4B:
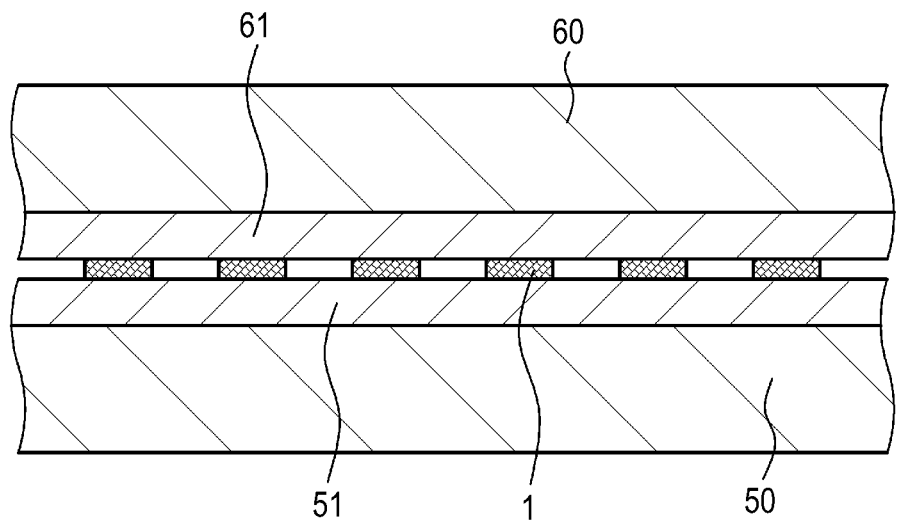
Figure 5A:
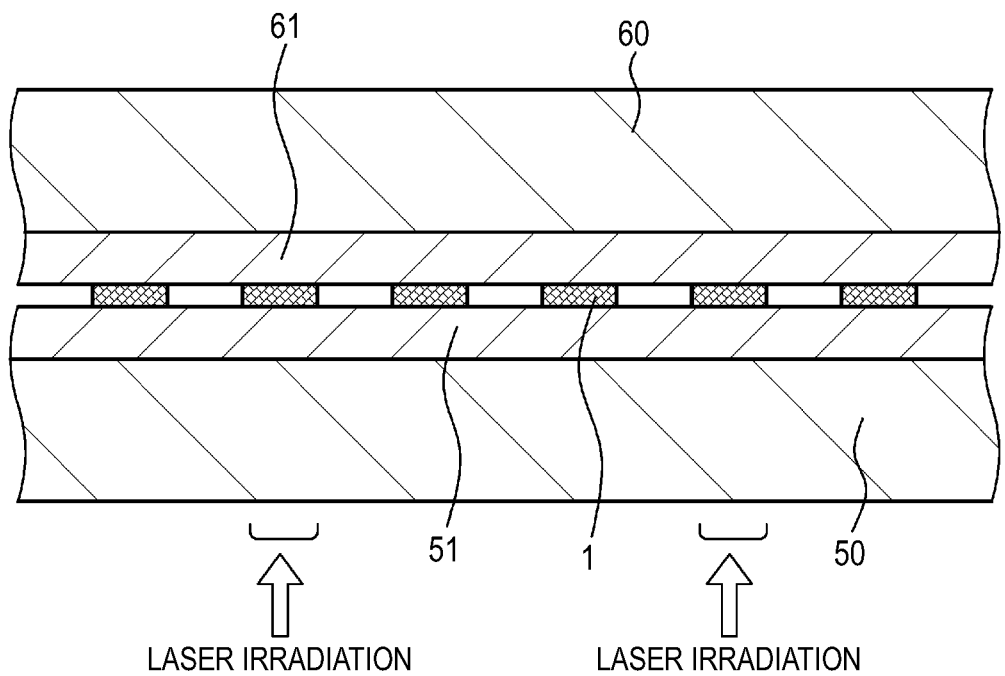
FIGS. 5A and 5B are schematic partial sectional views of a semiconductor light emitting device or the like for the purpose of explaining a preparation method of an image display apparatus of Example 2, subsequent to FIG. 4B.
Figure 5B:
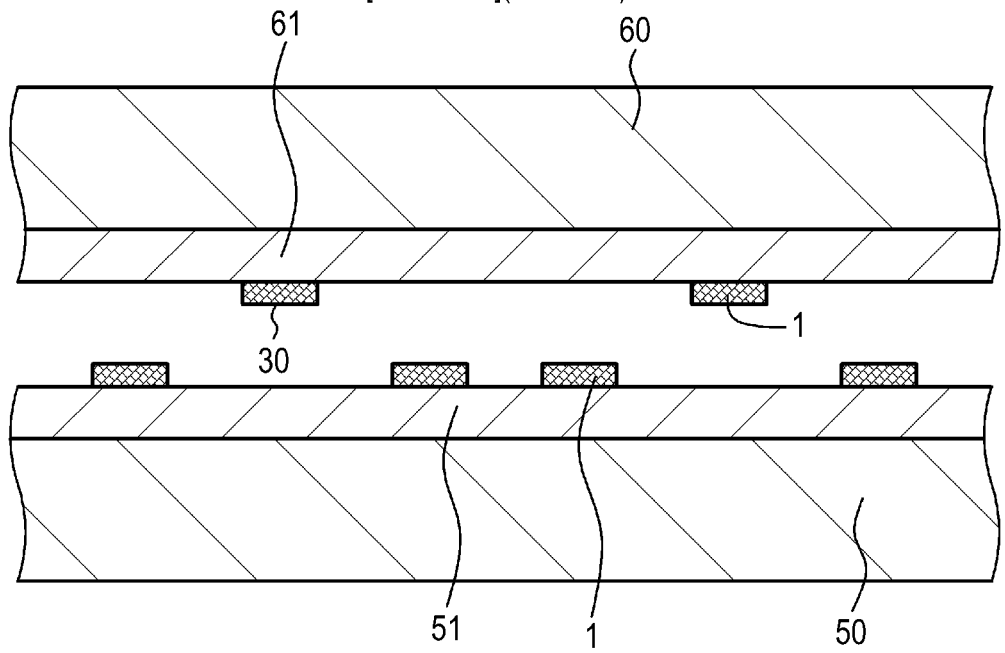

The chosen semiconductor light sensitive devices 1 are transferred onto the interconnection substrate 60 such that the exposed first compound semiconductor layer 21 and the first electrode 40 come into contact with the interconnection substrate 60. Specifically, the slightly adhesive layer 61 is pressed against the semiconductor light emitting devices 1 arranged in a two-dimensional matrix state on the supporting substrate 50 (see FIGS. 4A and 4B). Subsequently, for example, an excimer laser is irradiated on the semiconductor light emitting devices 1 to be transferred from the rear surface side of the supporting substrate 50 (see FIG. 5A). According to this, laser abrasion occurs, and the semiconductor light emitting devices 1 having an excimer laser irradiated thereon peel apart from the supporting substrate 50. Thereafter, when the contact of the interconnection substrate 60 with the semiconductor light emitting devices 1 is removed, the semiconductor light emitting devices 1 having peeled apart from the supporting substrate 50 become in a state in which they attach to the slightly adhesive layer 61 (see FIG. 5B).

[Step 210]

Figure 6A:
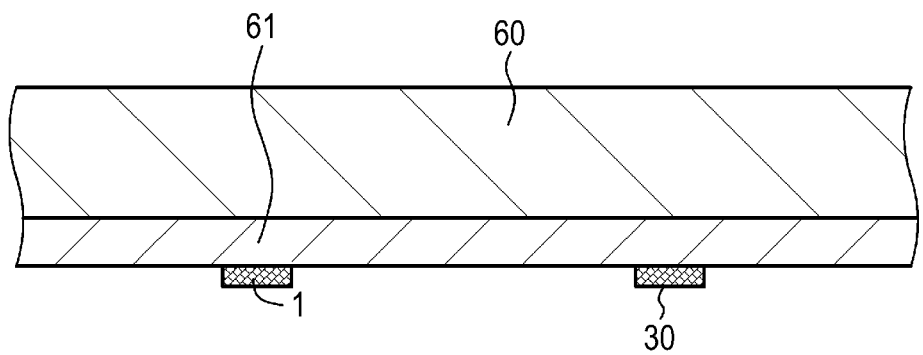
FIGS. 6A and 6B are schematic partial sectional views of a semiconductor light emitting device or the like for the purpose of explaining a preparation method of an image display apparatus of Example 2, subsequent to FIG. 5B.
Figure 6B:
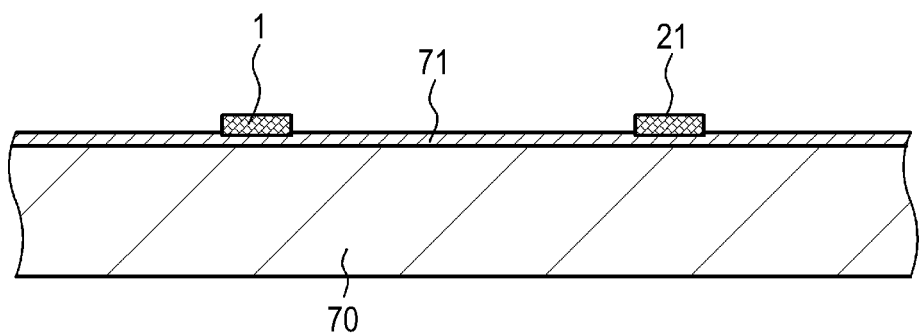

Subsequently, the semiconductor light emitting devices 1 are disposed (moved or transferred) on the adhesive layer 71 (see FIGS. 6A and 6B). Specifically, the semiconductor light emitting devices 1 are disposed on the adhesive layer 71 of the second interconnection substrate 70 from the interconnection substrate 60 on the basis of the alignment marks formed on the second interconnection substrate 70. The semiconductor light emitting devices 1 merely attach weakly to the slightly adhesive layer 61; and therefore, when the interconnection substrate 60 is moved in a direction where it leaves from the second interconnection substrate 70 in a state in which the semiconductor light emitting devices 1 are brought into contact with (pressed against) the adhesive layer 71, the semiconductor light emitting devices 1 are left on the adhesive layer 71. Furthermore, by deeply burying the semiconductor light emitting devices 1 into the adhesive layer 71 by a roller or the like, the semiconductor light emitting devices 1 can be transferred onto the second interconnection substrate 70.

Such a mode using the interconnection substrate 60 is called a step transfer method for the sake of convenience. By repeating such a step transfer method in a desired number, a desired number of the semiconductor light emitting devices 1 attach in a two-dimensional matrix state to the slightly adhesive layer 61 and are transferred onto the second interconnection substrate 70. Specifically, in Example 2, in the step transfer of one time, the semiconductor light emitting devices 1 in a number of 160×120 are made to attach in a two-dimensional matrix state to the slightly adhesive layer 61 and transferred onto the second interconnection substrate 70. In consequence, by repeating the step transfer method of {(1,920×1,080)/(160×120)}=108 times, the semiconductor light emitting devices 1 in a number of 1,920×1,080 can be transferred onto the second interconnection substrate 70. By repeating the foregoing steps three times in total, each of a red semiconductor light emitting device (red light emitting diode), a green semiconductor light emitting device (green light emitting diode) and a blue semiconductor light emitting device (blue light emitting diode) in a desired number can be transferred on the second interconnection substrate 70 at prescribed intervals and pitches.

Thereafter, ultraviolet rays are irradiated on the adhesive layer 71 made of a photosensitive resin and having the semiconductor light emitting devices 1 disposed therein, thereby curing the photosensitive resin constituting the adhesive layer 71. In this way, the semiconductor light emitting devices 1 become in a state in which they are fixed to the adhesive layer 71. Subsequently, the semiconductor light emitting devices 1 are temporarily fixed to a second substrate for temporary fixing via the first electrode 40. Specifically, the second substrate for temporary fixing composed of a glass plate in which an adhesive layer 80 made of an uncured adhesive is formed on the surface thereof is prepared. Then, by sticking the semiconductor light emitting devices 1 and the adhesive layer 80 to each other and curing the adhesive layer 80, the semiconductor light emitting devices 1 can be temporarily fixed to the second substrate for temporary fixing. Subsequently, the adhesive layer 71 and the second interconnection substrate 70 are removed from the semiconductor emitting devices 1 by an adequate method. This state is a state in which the connecting layer 38 of the semiconductor light emitting device 1 is exposed.

[Step 220]

Figure 7:
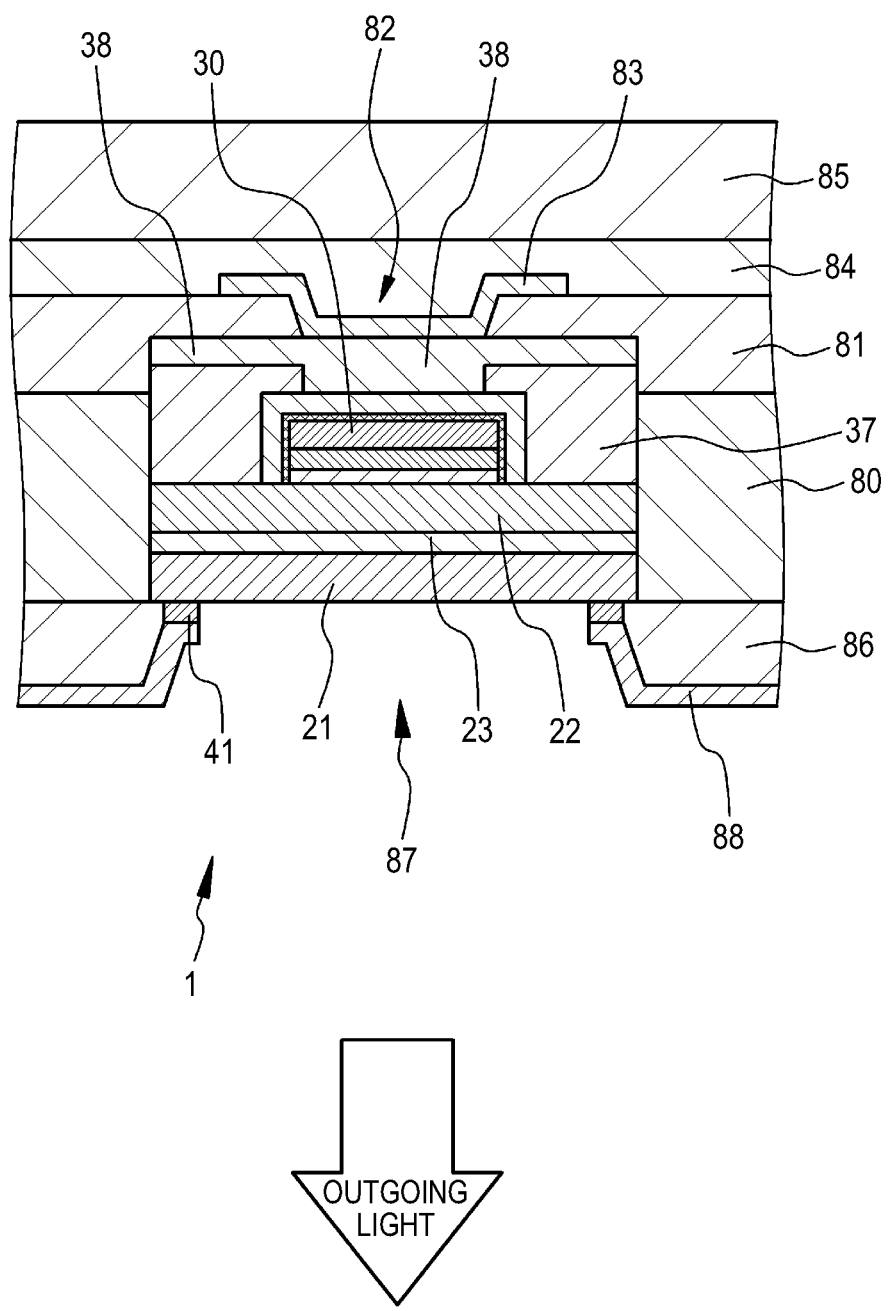
FIG. 7 is a schematic partial sectional view of a semiconductor light emitting device or the like for the purpose of explaining a preparation method of an image display apparatus of Example 2, subsequent to FIG. 6B.

Subsequently, a second insulating layer 81 is formed on the entire surface, an aperture 82 is formed in the second insulating layer 81 in an upper part of the connecting layer 38, and a second wiring 83 is formed over the aperture 82 and the second insulating layer 81 above the connecting layer 38. The second wiring 83 extends in a vertical direction on FIG. 7. Subsequently, by sticking the second insulating layer 81 including the second wiring 83 and a substrate 85 for mounting made of a glass substrate to each other via an adhesive layer 84, the semiconductor light emitting devices 1 can be mounted (fixed) on the substrate 85 for mounting. Subsequently, for example, an excimer laser is irradiated from, for example, the rear surface side of the second substrate for temporary fixing. According to this, laser abrasion occurs, and the semiconductor light emitting devices 1 having an excimer laser irradiated thereon peel apart from the second substrate for temporary fixing. This state is a state in which the first electrode 40 of the semiconductor light emitting device 1 is exposed. Subsequently, a first insulating layer 86 is formed on the entire surface, an aperture 87 is formed in the first insulating layer 86 in an upper part of the first electrode 40 of the semiconductor light emitting device 1, and a first wiring 88 is formed over the aperture 87 and the first insulating layer 86 above the first electrode 40. The first wiring 88 extends in a horizontal direction on FIG. 7. This state is shown by a schematic partial sectional view of FIG. 7. Then, by connecting the first wiring 88 and the second wiring 83 to a drive circuit on the basis of an adequate method, a semiconductor light emitting device and an image display apparatus constituted of such a semiconductor light emitting device can be completed. In the semiconductor light emitting device 1, light emitted in the active layer 23 is outgone toward the direction of a lower side of FIG. 7.

Example 3

Figure 8A:
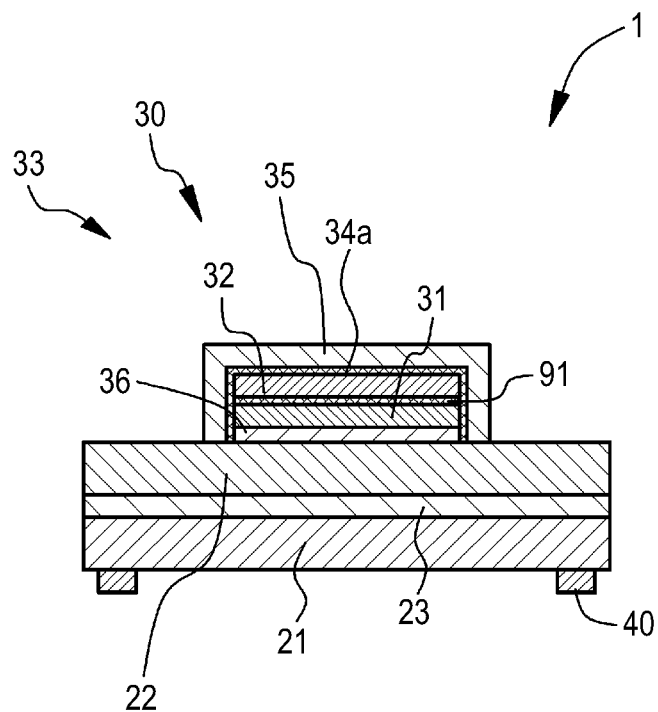
FIGS. 8A and 8B are schematic sectional views of a semiconductor light emitting device of Examples 3 and 4.

Example 3 is a modification of Example 1. In Example 3, as shown in a schematic partial sectional view of FIG. 8A, in the second electrode structure 33, a migration blocking layer 91 is provided between the first layer 31 and the second layer 32. The migration blocking layer 91 is made of platinum (Pt) having a thickness of 0.1 µm, and the second electrode structure 33 constituted of the first layer 31, the migration blocking layer 91 and the second layer 32 may be formed in the same step as in the Step 110 of Example 1. In this way, by providing the migration blocking layer 91 between the first layer 31 and the second layer 32, it is possible to suppress occurrence of migration of the silver atom constituting the first layer 31.

Example 4

Example 4 is also a modification of Example 1. In Example 4, the second electrode structure 33 is subjected to an oxygen plasma treatment before subjecting the second electrode structure 33 to a zincate treatment in the same step as in the Step 120 of Example 1. According to this, the surface of the second electrode structure 33 is uniformly oxidized. As a result, it is possible to contrive to make the zinc layer 34 to be deposited by the zincate treatment uniform.

Furthermore, in Example 4, after the same step as in the Step 120 of Example 1 is completed, the zinc layer 34 deposited by the zincate treatment in the Step 120 is removed. Specifically, the whole of the laminated structure 20 including the second electrode structure 33 is dipped in sulfuric acid. Subsequently, the second electrode structure 33 is subjected to a second zincate treatment, thereby depositing the zinc layer (second seed layer) 34 on the top surface and the side surface of the second electrode structure 33. A treatment time in the second zincate treatment was made shorter than a treatment time in the first zincate treatment. According to this, a uniform zincate treatment can be expected within a short time by the second zincate treatment. In this way, by once removing the zinc layer deposited by the zincate treatment and then applying the second zincate treatment, higher adhesion between the second electrode structure 33 and the nickel layer 35 and uniformity can be obtained. Also, in the case where aluminum constituting the second layer 32 is scattered by the oxygen plasma treatment and attaches to an undesired region (for example, the second compound semiconductor layer 22 or the like), there is a concern that a zinc layer is formed in the undesired region. However, by once removing the zinc layer deposited by the zincate treatment, zinc attached to the undesired region is removed. Thus, occurrence of such a problem can be prevented.

Example 5

Example 5 is also a modification of Example 1. In Example 5, after an alloying layer coming into contact with the second layer 32 is formed in the same step as in the Step 110 of Example 1, a thermal treatment is applied to promote alloying between aluminum contained in the second layer 32 and a metal contained in the alloying layer, thereby obtaining the second layer 32 made of an aluminum alloy. Specifically, an alloying layer having a thickness of 10 nm and made of gold (Au) is deposited directly above the second layer 32 having a thickness of 50 nm and made of aluminum by a vacuum vapor deposition method and subsequently heated at 150° C. or higher, thereby forming the second layer 32 made of an aluminum alloy (Al/Au). In this way, by constituting the second layer 32 of an aluminum alloy, the displacement rate at which aluminum (Al) is displaced by zinc (Zn) in the zincate treatment can be controlled; the uniform zinc layer 34 can be formed; and furthermore, the uniform nickel layer 35 (electroless nickel plating layer) can be formed. There are obtained experimental results in which the faster the displacement rate, the larger the amount of each of the first layer 31 and the close contact layer 36 to be subjected to side etching in the zincate treatment. There are also obtained experimental results in which when the amount of side etching increases, abnormal deposition of the nickel layer (electroless nickel plating layer) or occurrence of abnormality of the deposition shape increases.

A second layer made of an aluminum alloy can also be obtained by, for example, depositing the second layer by a sputtering method while using an alloy of aluminum (Al) and a copper (Cu) as a target in place of such an alloying treatment.

Example 6

Figure 8B:
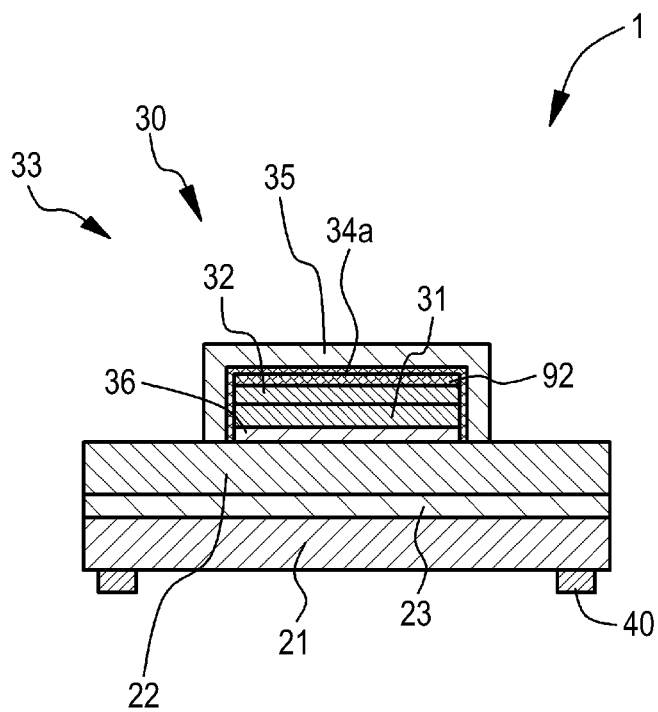
Figure 9:
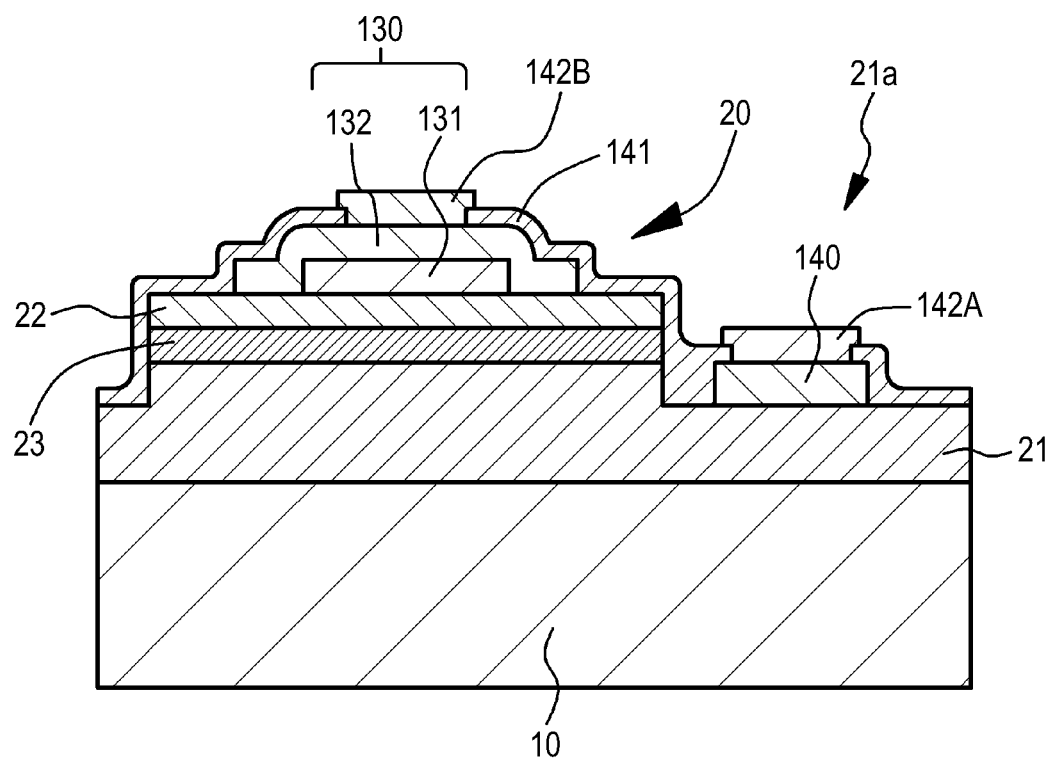
FIG. 9 is a schematic partial sectional view of a related-art semiconductor light emitting device.
Figure 10A:
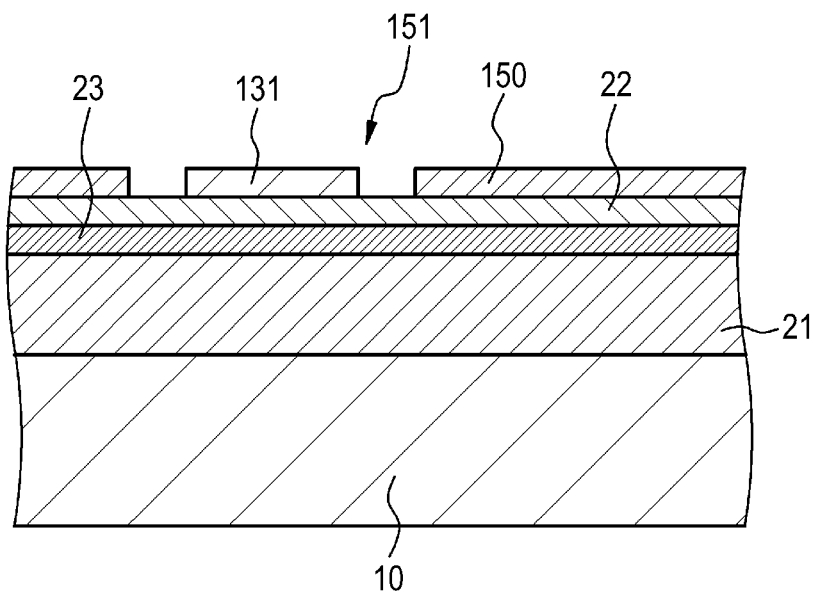
FIGS. 10A and 10B are schematic partial sectional view of a substrate or the like showing a part of manufacturing steps of the related-art semiconductor light emitting device shown in FIG. 9.
Figure 10B:
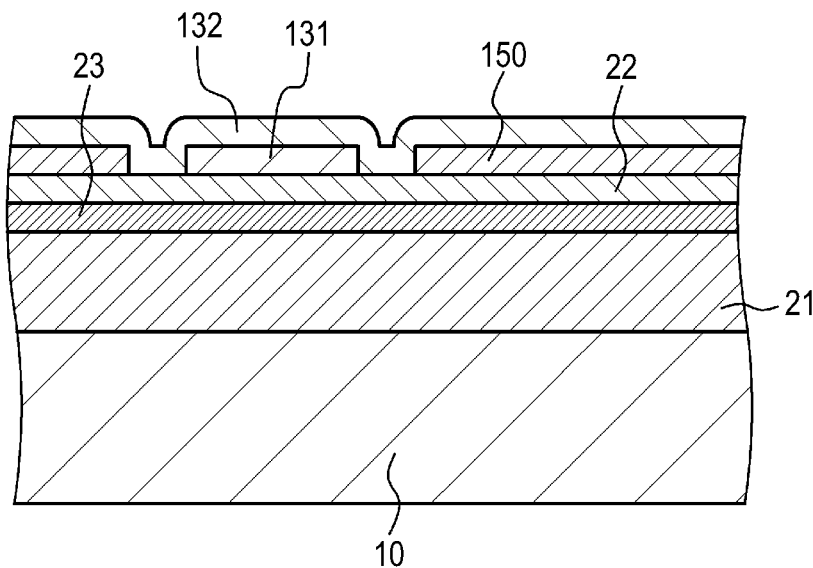

Example 6 is also a modification of Example 1. In Example 6, by forming a covering layer 92 having a thickness of 30 nm and made of gold (Au) on the second layer 32 in the same step as in the Step 110 of Example 1, the second electrode structure 33 composed of the first layer 31, the second layer 32 and the covering layer 92 is obtained. Then, by subjecting the second electrode structure 33 to a zincate treatment in the same step as in Step 120 of Example 1, the zinc layer 34 is deposited on the top surface and the side surface of the second electrode structure 33. Specifically, the zinc layer 34 is deposited on the top surface and the side surface of the covering layer 92, the side surface of the second layer 32, the side surface of the first layer 31 and the side surface of the close contact layer 36. That is, the whole of the second electrode structure 33 is covered by the zinc layer 34. In this way, by providing the covering layer 92 on the top surface of the second layer 32, the displacement amount at which aluminum (Al) is displaced by zinc (Zn) in the zincate treatment can be controlled; the uniform zinc layer 34 can be formed; and furthermore, the uniform electroless nickel plating layer can be formed. A schematic partial sectional view of the finally obtained semiconductor light emitting device is shown in FIG. 8B.

The constitutions and structures, of the semiconductor light emitting device, materials constituting the semiconductor light emitting device, manufacturing conditions of the semiconductor light emitting device and a variety of numerical values as described in the Examples are merely examples, and they can be properly changed. The semiconductor light emitting devices of Examples 3 to 6 can be applied to the image display apparatus described in Example 2. Also, Example 3 and Example 4 can be combined; Example 3 and Example 5 can be combined; Example 3 and Example 6 can be combined; Example 4 and Example 5 can be combined; Example 4 and Example 6 can be combined; Example 5 and Example 6 can be combined; Example 3, Example 4 and Example 5 can be combined; Example 3, Example 4 and Example 6 can be combined; Example 3, Example 5 and Example 6 can be combined; Example 4, Example 5 and Example 6 can be combined; Example 3, Example 4, Example 5 and Example 6 can be combined; and furthermore, these combinations can be applied to Example 2.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A semiconductor light emitting device comprising:
a light emitting portion; and
an electrode formed on the light emitting portion, the electrode including
a light reflecting layer configured to reflect light emitted from the light emitting portion and including a first metal,
a first seed layer formed directly on the light reflecting layer and including a second metal,
a second seed layer coating at least side surfaces of the light reflecting layer and the first seed layer, the second seed layer including a third metal, and
a plating layer coating at least top and side surfaces of the second seed layer, the plating layer including a fourth metal,
wherein at least a portion of the third metal of the second seed layer displaces at least a portion of the second metal of the first seed layer when forming the second seed layer.

2. The semiconductor light emitting device according to claim 1, wherein the second seed layer is formed directly on the first seed layer and also coats a top surface of the first seed layer.

3. The semiconductor light emitting device according to claim 1, wherein a close contact layer comprising nickel is formed between the light reflecting layer and the light emitting portion.

4. The semiconductor light emitting device according to claim 1, wherein the first, second, third and fourth metals are different from one another.

5. The semiconductor light emitting device according to claim 1, wherein the third metal is Zn and the fourth metal is Ni.

6. The semiconductor light emitting device according to claim 1, further comprising
an insulating layer formed to cover the electrode and having an aperture formed therein to expose at least a portion of an upper surface of the electrode, and
a connecting layer extending on the insulating layer from the upper surface of the electrode.

7. The semiconductor light emitting device according to claim 1, further comprising a migration blocking layer comprising platinum, the migration blocking layer being provided between the light reflecting layer and the first seed layer,
wherein the second seed layer coats side surfaces of the light reflecting layer, the first seed layer, and the migration blocking layer, and coats a top surface of the first seed layer.

8. The semiconductor light emitting device according to claim 1, further comprising a gold covering layer formed directly on the first seed layer,
wherein the second seed layer coats side surfaces of the light reflecting layer, the first seed layer, and the gold covering layer, and coats a top surface of the gold covering layer.

9. A semiconductor light emitting device comprising:
a light emitting portion including
a first semiconductor layer having a first conductivity type,
an active layer, and
a second semiconductor layer having a second conductivity type that is opposite to the first conductivity type; and
an electrode formed on the light emitting portion, the electrode including
a light reflecting layer comprising Ag and configured to reflect light emitted from the light emitting portion,
a first seed layer comprising Al and formed on the light reflecting layer,
a second seed layer comprising Zn and coating at least side surfaces of the light reflecting layer and the first seed layer, and
a plating layer comprising Ni and coating at least top and side surfaces of the second seed layer,
wherein at least a portion of the Zn of the second seed layer displaces at least a portion of the Al of the first seed layer when forming the second seed layer.

10. The semiconductor light emitting device according to claim 9, wherein the second seed layer is formed directly on the first seed layer and also coats a top surface of the first seed layer.

11. The semiconductor light emitting device according to claim 9, wherein a close contact layer comprising nickel is formed between the light reflecting layer and the second semiconductor layer of the light emitting portion.

12. The semiconductor light emitting device according to claim 9, further comprising
an insulating layer formed to cover the electrode and having an aperture formed therein to expose at least a portion of an upper surface of the electrode, and
a connecting layer extending on the insulating layer from the upper surface of the electrode.

13. The semiconductor light emitting device according to claim 9, further comprising a migration blocking layer comprising platinum, the migration blocking layer being provided between the light reflecting layer and the first seed layer,
wherein the second seed layer coats side surfaces of the light reflecting layer, the first seed layer, and the migration blocking layer, and coats a top surface of the first seed layer.

14. The semiconductor light emitting device according to claim 1, further comprising a gold covering layer formed directly on the first seed layer,
wherein the second seed layer coats side surfaces of the light reflecting layer, the first seed layer, and the gold covering layer, and coats a top surface of the gold covering layer.

* * * * *